(12) United States Patent
Kim

(10) Patent No.: US 9,232,122 B2
(45) Date of Patent: Jan. 5, 2016

(54) CAMERA MODULE HAVING AN ARRAY SENSOR

(71) Applicant: LG INNOTEK CO., LTD., Seoul (KR)

(72) Inventor: Min Soo Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 75 days.

(21) Appl. No.: 14/030,499

(22) Filed: Sep. 18, 2013

(65) Prior Publication Data

US 2014/0078388 A1    Mar. 20, 2014

(30) Foreign Application Priority Data

Sep. 19, 2012  (KR) .................. 10-2012-0104073
Sep. 28, 2012  (KR) .................. 10-2012-0109211

(51) Int. Cl.
*H04N 5/225* (2006.01)
*H04N 13/02* (2006.01)

(52) U.S. Cl.
CPC ........... *H04N 5/2254* (2013.01); *H04N 5/2257* (2013.01); *H04N 13/0242* (2013.01)

(58) Field of Classification Search
CPC .................. H01L 27/14627; H01L 27/14618; H01L 27/14623; H01L 31/0232; H04N 5/2254; H04N 5/2257
USPC ......................................... 348/373–374, 340
See application file for complete search history.

(56) References Cited

U.S. PATENT DOCUMENTS

| | | | |
|---|---|---|---|
| 2001/0026322 A1* | 10/2001 | Takahashi et al. | 348/340 |
| 2003/0112364 A1* | 6/2003 | Tanida et al. | 348/375 |
| 2004/0012698 A1* | 1/2004 | Suda et al. | 348/315 |
| 2004/0017501 A1* | 1/2004 | Asaga et al. | 348/340 |
| 2007/0211164 A1 | 9/2007 | Olsen et al. | |
| 2008/0007623 A1* | 1/2008 | Lee et al. | 348/207.99 |
| 2008/0143871 A1* | 6/2008 | Go | 348/374 |
| 2008/0237766 A1* | 10/2008 | Kim | 257/432 |
| 2009/0086055 A1* | 4/2009 | Tower et al. | 348/229.1 |
| 2010/0059844 A1* | 3/2010 | Tanaka | 257/432 |
| 2010/0097519 A1 | 4/2010 | Byrne et al. | |
| 2011/0037886 A1* | 2/2011 | Singh et al. | 348/340 |
| 2011/0169118 A1* | 7/2011 | Sano | 257/432 |
| 2012/0188420 A1 | 7/2012 | Black et al. | |
| 2012/0218448 A1* | 8/2012 | Ueno et al. | 348/273 |
| 2012/0257031 A1* | 10/2012 | Tsuchiya et al. | 348/77 |
| 2012/0300102 A1* | 11/2012 | Tamura et al. | 348/294 |
| 2012/0312993 A1* | 12/2012 | Fendler et al. | 250/353 |
| 2012/0320242 A1* | 12/2012 | Ogita et al. | 348/276 |
| 2013/0083229 A1* | 4/2013 | Lin et al. | 348/336 |
| 2013/0258259 A1* | 10/2013 | Nakai | 349/106 |

FOREIGN PATENT DOCUMENTS

WO    WO 2011/019409 A1    2/2011

* cited by examiner

*Primary Examiner* — Chia-Wei A Chen
(74) *Attorney, Agent, or Firm* — Birch, Stewart, Kolasch & Birch, LLP

(57) ABSTRACT

An exemplary embodiment of the present disclosure includes an array sensor arrayed with a plurality of image sensors, and a plurality of lens units respectively mounted on the plurality of image sensors.

18 Claims, 6 Drawing Sheets

CAMERA MODULE HAVING AN ARRAY SENSOR

Pursuant to 35 U.S.C. §119(a), this application claims the benefit of earlier filing dates and rights of priority to Korean Patent Application No. 10-2012-01044073, filed on Sep. 19, 2012, and Korean Patent Application No. 10-2012-0109211, filed on Sep. 28, 2012, the contents of which are hereby incorporated by reference in their entirety.

BACKGROUND OF THE DISCLOSURE

1. Field of Endeavor

The teachings in accordance with exemplary and non-limiting embodiments of this disclosure generally relate to a camera module.

2. Background

Recently, small-sized camera modules are highly demanded on a variety of multimedia fields, such as tablet computers, camera phones, PDAs (Personal Digital Assistants), smart phones, and image input devices, such as monitoring cameras and information terminals of video tape recorders.

The camera modules mounted on these types of electronic devices require miniaturized size and light weight.

The camera module includes a lens unit configured to pass an optical image of an object, and an image sensor capturing the optical image that has passed the lens unit.

The lens unit and the image sensor are components essential for a camera module, and technical developments are being vigorously pursued to improve assemblage between the camera module and the components.

Furthermore, a variety of attempts are being recently waged for electric devices to realize better developed functions in addition to the function of capturing an object through a camera module.

Meantime, a 3D camera of stereoscopic method or an input device is realized by two cameras, disadvantages of which include, for example, presence of an area where two cameras cannot capture an object and limited depth level of obtained image.

SUMMARY OF THE DISCLOSURE

Exemplary embodiments of the present disclosure provide a camera module configured to obtain a clear 3D image and accurate input information or depth information by applying a plurality of image sensors so arrayed as to obtain as much information as possible on an object.

In one general aspect of the present disclosure, there is provided a camera module, the camera module comprising:

an array sensor arrayed with a plurality of image sensors; and a plurality of lens units respectively mounted on the plurality of image sensors.

Preferably, but not necessarily, the plurality of image sensors may be arrayed on one surface of the array sensor and solder balls are mounted on the other surface of the array sensor.

Preferably, but not necessarily, the array sensor may be mounted on a PCB (Printed Circuit Board) by allowing the solder balls to be soldered to the PCB, where the lens units may be WLO (Wafer Level Optics) lenses.

Preferably, but not necessarily, a holder or a shield can disposed with windows configured to pass the optical image of the object to the plurality of lens units may be fixed to the array sensor.

Preferably, but not necessarily, a blocking member configured to block spill light may be interposed between the holder or inner walls of the windows of the shield can and the lens units.

Preferably, but not necessarily, the blocking member may be interposed between the holder or inner walls of the windows of the shield can and the lens units.

Preferably, but not necessarily, a partition extended from the holder or the shield can may be fixed to an array sensor area between each of the lens units in order to isolate each lens unit.

Preferably, but not necessarily, the camera module further comprises a ground line formed at the array sensor area distanced from each of the image sensors.

Preferably, but not necessarily, a holder or a shield can disposed with windows configured to pass an optical image of an object to the plurality of lens units may be fixed to the array sensor, and the holder or the shield can may be brought into contact with the ground line.

Preferably, but not necessarily, the image sensors may photograph 3D images.

Preferably, but not necessarily, a 3D depth may be extracted from the image photographed by the image sensors.

In another general aspect of the present disclosure, there is provided a camera module, the camera module comprising:

an array sensor arrayed with a plurality of image sensors; and an array lens unit integrally arrayed with lens units each optically aligned on the plurality of image sensors of the array sensor.

In still another general aspect of the present disclosure, there is provided a camera module, the camera module comprising an array lens unit including a plurality of lens units, and connection units connected to the lens units.

Preferably, but not necessarily, a holder or a shield can disposed with windows configured to pass an optical image of an object to the lens units of the array lens unit may be fixed to the array sensor.

A 3D image in a camera module according to exemplary embodiments of the present disclosure can be extracted from images photographed by a plurality of image sensors to allow the plurality of image sensors to be used as input devices.

Much information on an object can be obtained by a plurality of image sensors in a camera module according to exemplary embodiments of the present disclosure to allow obtaining a clearer 3D image and accurate input information or depth information.

DETAILED DESCRIPTION

Now, the camera module according to exemplary embodiments of the present invention will be described in detail with reference to the accompanying drawings.

In describing the present disclosure, certain layers, sizes, shapes, components or features may be exaggerated for clarity and convenience. Accordingly, the meaning of specific terms or words used in the specification and claims should not be limited to the literal or commonly employed sense, but should be construed or may be different in accordance with the intention of a user or an operator and customary usages. Therefore, the definition of the specific terms or words should be based on the contents across the specification.

Figure 1:
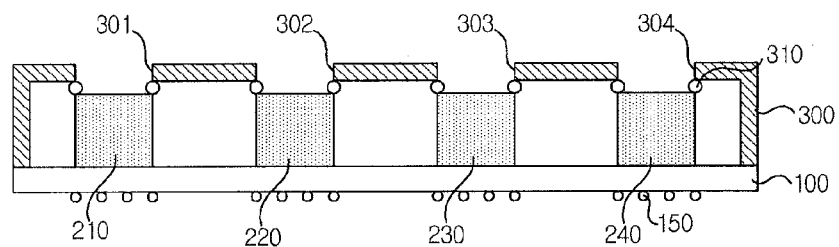
FIG. 1 is a mimetic cross-sectional view illustrating a camera module according to an exemplary embodiment of the present disclosure.

FIG. 1 is a mimetic cross-sectional view illustrating a camera module according to an exemplary embodiment of the present disclosure.

Referring to FIG. 1, the camera module according to an exemplary embodiment of the present disclosure includes an array sensor (100) arrayed with a plurality of image sensors, and a plurality of lens units (210, 220, 230, 240) respectively mounted on a plurality of image sensors of the array sensor (100).

At this time, the plurality of image sensors may be arrayed on one surface of the array sensor (100), and solder balls (150) may be mounted on the other surface of the array sensor (100).

Furthermore, the array sensor (100) may be mounted on a PCB (Printed Circuit Board) by allowing the solder balls to be soldered to the PCB according to an exemplary embodiment of the present disclosure, where the lens units (210, 220, 230, 240) may be WLO (Wafer Level Optics) lenses, where, although the lens units (210, 220, 230, 240) are illustrated with four lens units in FIG. 1, the present disclosure is not limited thereto.

Referring to FIG. 1 again, a holder or a shield can (300) disposed with windows (301, 302, 303, 304) configured to pass an optical image of an object to the plurality of lens units (210, 220, 230, 240) may be fixed to the array sensor (100), or both the holder and the shield can (300) may be fixed to the array sensor (100). The lens units (210, 220, 230, 240) may be embedded in the holder and the shield can (300), and the holder and the shield can (300) may be fixed to the array sensor (100) or the PCB.

Furthermore, a blocking member (310) configured to block spill light may be interposed between the holder or the shield can (300) and the lens units (210, 220, 230, 240).

At this time, the blocking member (310) may be interposed between the holder or inner walls of the windows (301, 302, 303, 304) of the shield can (300) and the lens units (210, 220, 230, 240). The blocking member (310) may be applied with epoxy, or the spill light may be blocked by the holder or the shield can (300) itself.

Figure 2A:
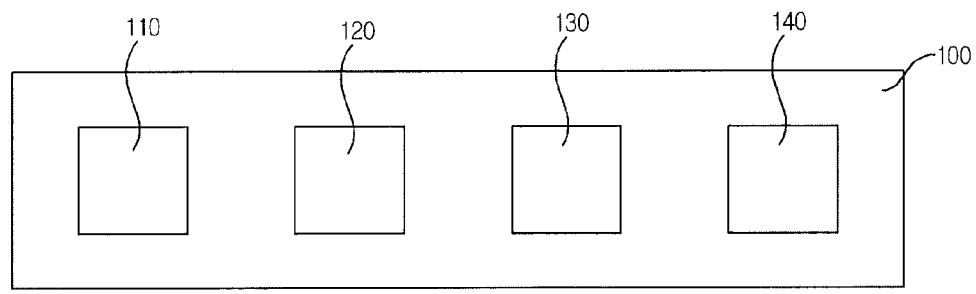
FIGS. 2a and 2b are schematic plan views illustrating an array sensor of a camera module according to an exemplary embodiment of the present disclosure.
Figure 2B:
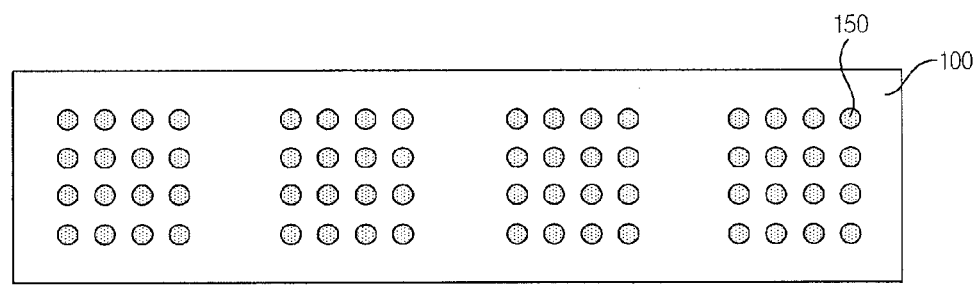

FIGS. 2a and 2b are schematic plan views illustrating an array sensor of a camera module according to an exemplary embodiment of the present disclosure.

Referring to FIG. 2, the array sensor (100) of a camera module according to an exemplary embodiment of the present disclosure is arrayed with image sensors (110, 120, 130, 140).

Referring to FIG. 2a, the image sensors (110, 120, 130, 140) may be regularly arranged in a row, or may be irregularly arranged.

The image sensors (110, 120, 130, 140) may be also arranged in a matrix format.

The array sensor (100) may be an array of image sensors (110, 120, 130, 140) manufactured from a wafer.

Furthermore, the image sensors (110, 120, 130, 140) may be arrayed on one surface of the array sensor (100), and solder balls (150) may be attached to the other surface of the array sensor (100). The image sensors (110, 120, 130, 140) may be attached by wire-bonding without recourse to solder balls.

Figure 3:
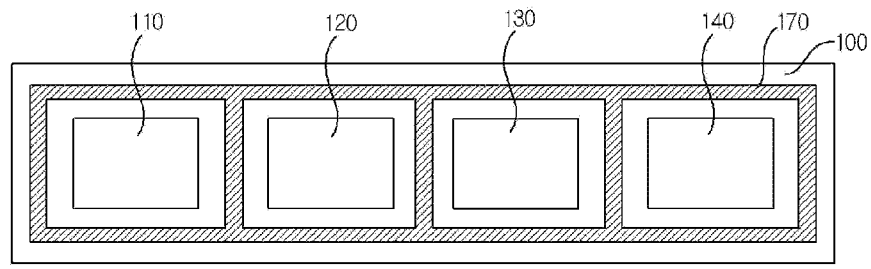
FIG. 3 is a mimetic plan view illustrating a ground line formed on an array sensor of a camera module according to an exemplary embodiment of the present disclosure.
Figure 4:
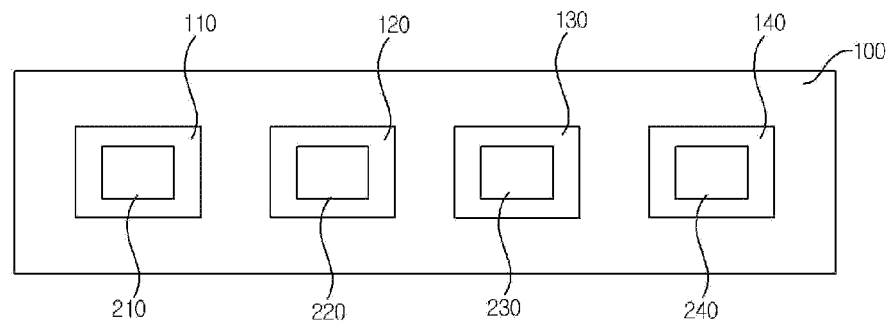
FIG. 4 is a mimetic plan view illustrating a lens unit placed on an array sensor of a camera module according to an exemplary embodiment of the present disclosure.
Figure 5:
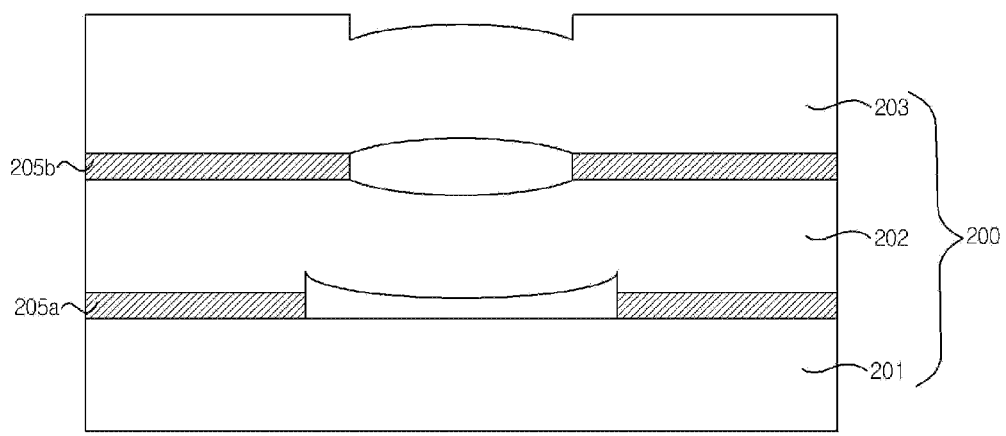
FIG. 5 is a mimetic cross-sectional view illustrating a structure of a WLO (Wafer Level Optics) lens of a camera module according to an exemplary embodiment of the present disclosure.

FIG. 3 is a mimetic plan view illustrating a ground line formed on an array sensor of a camera module according to an exemplary embodiment of the present disclosure, FIG. 4 is a mimetic plan view illustrating a lens unit placed on an array sensor of a camera module according to an exemplary embodiment of the present disclosure, and FIG. 5 is a mimetic cross-sectional view illustrating a structure of a WLO (Wafer Level Optics) lens of a camera module according to an exemplary embodiment of the present disclosure.

Referring to FIG. 3, a ground line (170) may be formed at an array sensor (100) area distanced from each of the image sensors (110, 120, 130, 140), where the holder or the shield can (300) may be brought into contact with the ground line (170).

Furthermore, as illustrated in FIG. 4, each upper surface of the image sensors (110, 120, 130, 140) may be positioned with the lens units (210, 220, 230, 240).

Referring to FIG. 5, in a case the lens units (210,220,230, 240) are WLO (Wafer Level Optics) lenses as described above, a structure of the lens units (210,220,230,240) may include a cover plate (201), and lenses (202, 203) stacked on the cover plate (201).

At this time, the lenses (202,203) may be sequentially attached to the cover plate (201) by adhesives (205a, 205b).

Figure 6:
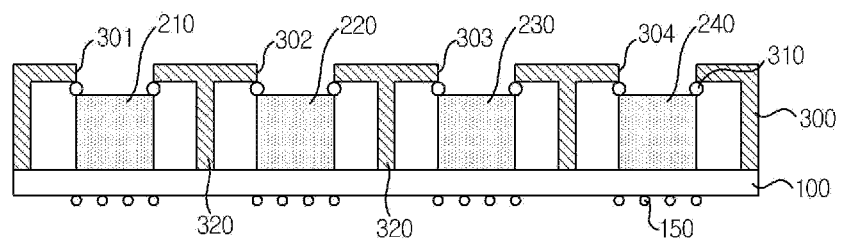
FIG. 6 is a mimetic cross-sectional view illustrating another structure of a camera module according to an exemplary embodiment of the present disclosure.
Figure 7:
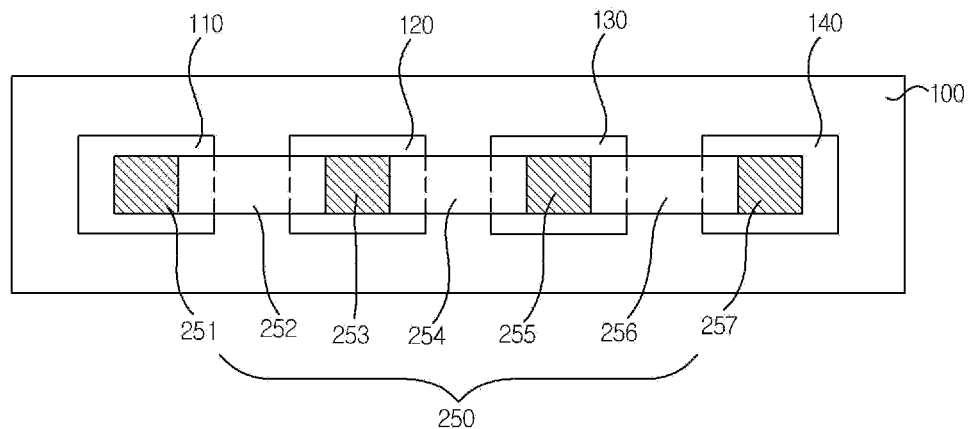
FIG. 7 is a mimetic plan view illustrating a structure of an array lens unit of a camera module according to an exemplary embodiment of the present disclosure.
Figure 8:
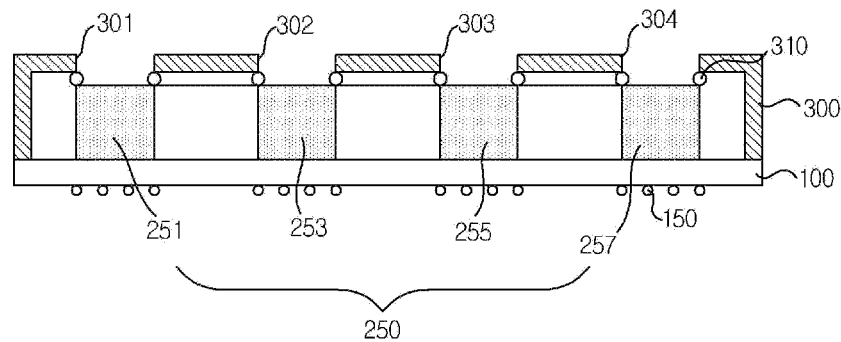
FIG. 8 is a mimetic plan view illustrating a camera module with the array lens unit of FIG. 7.

FIG. 6 is a mimetic cross-sectional view illustrating another structure of a camera module according to an exemplary embodiment of the present disclosure, FIG. 7 is a mimetic plan view illustrating a structure of an array lens unit of a camera module according to an exemplary embodiment of the present disclosure, and FIG. 8 is a mimetic plan view illustrating a camera module with the array lens unit of FIG. 7.

Referring to FIG. 6, a camera module according to an exemplary embodiment of the present disclosure is configured such that a holder or a shield can (300) may be fixed to an array sensor, and a partition (320) extended from the holder or the shield can (300) may be fixed to an array sensor (100) area between each of the lens units (210,220,230,240) in order to isolate each lens unit (210,220,230,240). Furthermore, as illustrate in FIG. 7, lens units (251, 253, 255, 257) may be integrally formed at an array lens unit (250). At this time, the array lens unit (250) may include the plurality of lens units (251, 253, 255, 257) and connection units (252, 254, 256) connected to the plurality of lens units (251, 253, 255, 257).

In addition, each of the image sensor units (110, 120, 130, 140) of the array sensor (100) may be optically aligned with the lens units (251, 253, 255, 257) of the array lens unit (250), where the array lens unit (250) may be positioned on or attached to the array sensor (100).

Thus, a camera module according to an exemplary embodiment of the present disclosure may include an array sensor (100) arrayed with a plurality of image sensors and an array lens unit (250) integrally arrayed with a plurality of lens units (251, 253, 255, 257) optically aligned on each of the image sensors of the array sensor (100).

Furthermore, a holder disposed with windows (301, 302, 303, 304) passing an optical image of an object to the lens units (251, 253, 255, 257) of the array lens unit (250) or a shield can may be fixed to the array sensor (100), as illustrated in FIG. 8.

Furthermore, a blocking member (310) configured to block spill light may be interposed between the holder or the shield can (300) and the lens units (251, 253, 255, 257) of the array lens unit (250). At this time, the blocking member (310) may be interposed between the holder or inner walls of the windows (301, 302, 303, 304) of the shield can (300) and the lens units (251, 253, 255, 257) of the array lens unit (250). At this time, the blocking member (310) may be applied with epoxy or the spill light may be blocked by the holder or the shield can (300) itself.

Meanwhile, as mentioned in the foregoing, although the array sensor (100) may be mounted on an upper surface of the PCB by soldering the solder balls attached to the other surface of the array sensor and the PCB, the array sensor may be mounted to the PCB by a method of inserting from a bottom surface of the PCB in the following another exemplary embodiment of the present disclosure.

Figure 9:
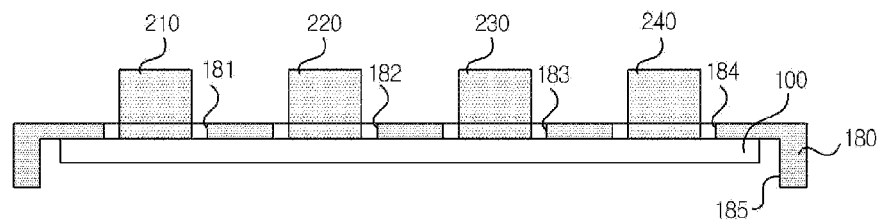
FIG. 9 is a mimetic cross-sectional view illustrating a camera module according to another exemplary embodiment of the present disclosure.
Figure 10A:
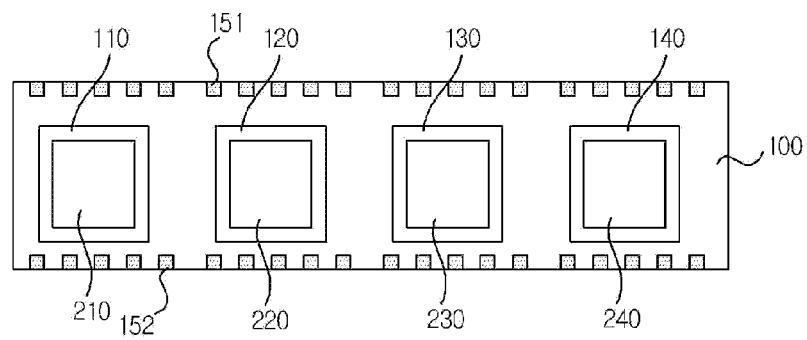
FIGS. 10a and 10b are schematic plan views illustrating an array sensor and a substrate of a camera module according to another exemplary embodiment of the present disclosure.
Figure 10B:
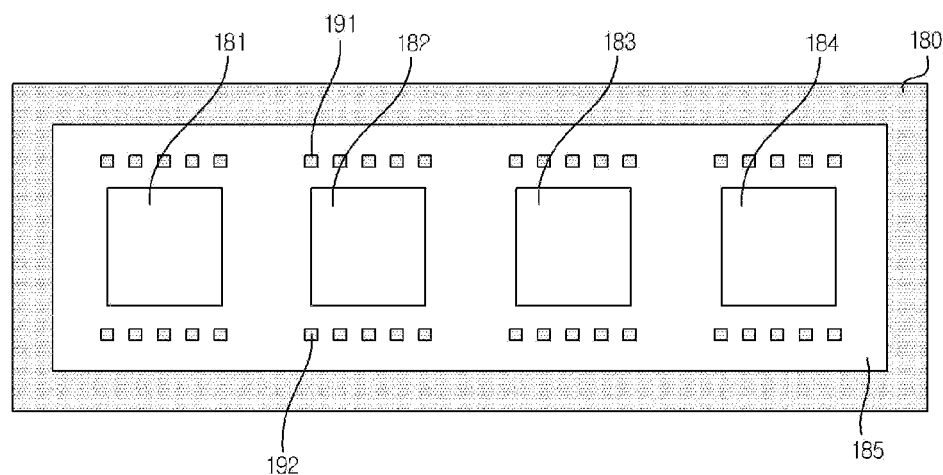

FIG. 9 is a mimetic cross-sectional view illustrating a camera module according to another exemplary embodiment of the present disclosure, and FIGS. 10a and 10b are schematic plan views illustrating an array sensor and a substrate of a camera module according to another exemplary embodiment of the present disclosure.

The camera module according to another exemplary embodiment of the present disclosure may include a substrate (180) formed with a cavity (185), and a plurality of through holes (181, 182, 193, 184) inside the cavity, an array sensor (100) inserted into the cavity (185) of the substrate (180) and arrayed with a plurality of image sensors, and lens units (210, 220, 230, 240) each mounted on the image sensors of the array sensor (100) and inserted into the through holes (181, 182, 193, 184).

At this time, the lens units (210, 220, 230, 240) may be WLO (Wafer Level Optics) lenses, where, although the lens units (210, 220, 230, 240) are illustrated with four lens units, it should be apparent that the present disclosure is not limited thereto.

Now, referring to FIG. 10a, first electrode terminals (151, 152) may be formed on the array sensor (100), and referring to FIG. 10b, second electrode terminals (191, 192) electrically bonded to the first electrode terminals (151, 152) may be formed on the substrate (180).

At this time, image sensors (110, 120, 130, 130) of the array sensor (100) may receive a driving power from an outside power source through the first electrode terminals (151, 152) and the second electrode terminals (191, 192), or may convert a captured optical image to an electrical signal and transmit to an outside device.

Furthermore, the array sensor (100) of a camera module according to another exemplary embodiment of the present disclosure is arrayed with the image sensors (110, 120, 130, 140).

Referring to FIG. 10a, the image sensors (110, 120, 130, 130) may be regularly arranged in a row, or may be irregularly arranged.

Furthermore, the image sensors (110, 120, 130, 140) may be arranged in a matrix format. Furthermore, the array sensor (100) may be an array of the image sensors (110, 120, 130, 140) manufactured from a wafer.

The substrate (180) may be a PCB, an upper surface or a bottom surface of the PCB may be formed with a ground line and/or a pass, and the holder or the shield can may be grounded by the ground line and/or the pass. The substrate may be a ceramic substrate for improving flatness.

Figure 11:
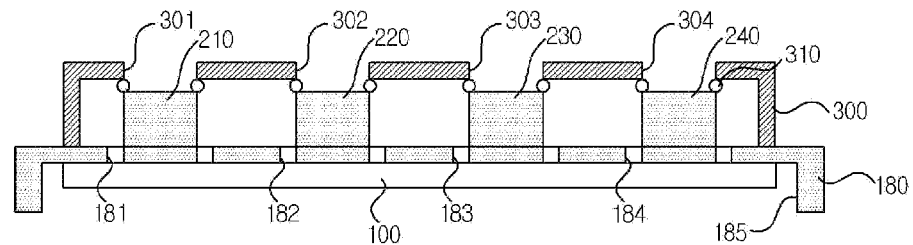
FIG. 11 is a mimetic cross-sectional view illustrating a holder and a shield can of a camera module according to another exemplary embodiment of the present disclosure.

FIG. 11 is a mimetic cross-sectional view illustrating a holder and a shield can of a camera module according to another exemplary embodiment of the present disclosure.

The camera module according to another exemplary embodiment of the present disclosure is configured such that a holder disposed with the windows (301, 302, 303, 304) configured to pass an optical image of an object to the lens units (210, 220, 230,240) or a shield can (300) may be fixed to the substrate (180).

The holder or the shield can (300) is embedded with the lens units (210, 220, 230, 240) and may be fixed to the substrate (180).

Furthermore, a blocking member (310) configured to block spill light may be interposed between the holder or the shield can and the lens units (210, 220, 230, 240).

At this time, the blocking member (310) may be interposed between the holder or inner walls of the windows (301, 302, 303, 304) of the shield can (300) and the lens units (210, 220, 230, 240). At this time, the blocking member (310) may be applied with epoxy.

A separate optical blocking member configured to block light to a lateral surface of each lens units may be formed among the lens units, or an optical blocking material may be provided.

In addition, a ground line may be formed at an array sensor (100) area distanced from each of the image sensors (110, 120, 130, 140). At this time, the ground line may be electrically connected to the holder or the shield can through the ground line of the substrate. The holder or the shield can may be formed with a conductive material, or a conductive material may be coated on a part or an entire area of the holder or the shield can.

Meanwhile, the camera module according to another exemplary embodiment of the present disclosure may include the technical characteristics illustrated in FIGS. 4 and 5.

To be more specific, as illustrated in FIG. 4, the lens units (210, 220, 230, 240) may be positioned on each upper surface of the image sensors (110, 120, 130, 140) according to the another exemplary embodiment of the present disclosure.

Referring to FIG. 5, in a case the lens units (210, 220, 230, 240) are WLO (Wafer Level Optics) lenses, a structure of the lens units (210, 220, 230, 240) may include a cover plate (201) and lenses (202, 203) stacked on the cover plate (201).

At this time, the lenses (202, 203) may be sequentially attached to the cover plate (201) by adhesives (205a, 205b).

Figure 12:
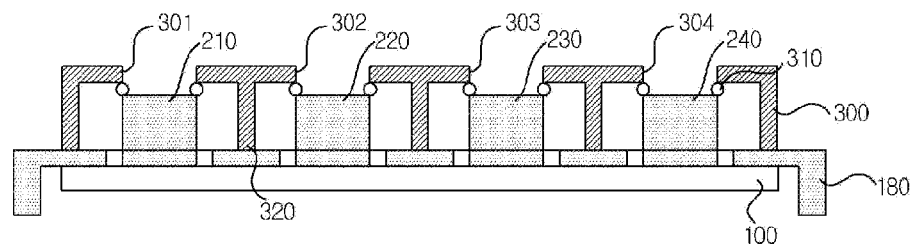
FIG. 12 is a mimetic cross-sectional view illustrating another structure of a camera module according to another exemplary embodiment of the present disclosure.
Figure 13:
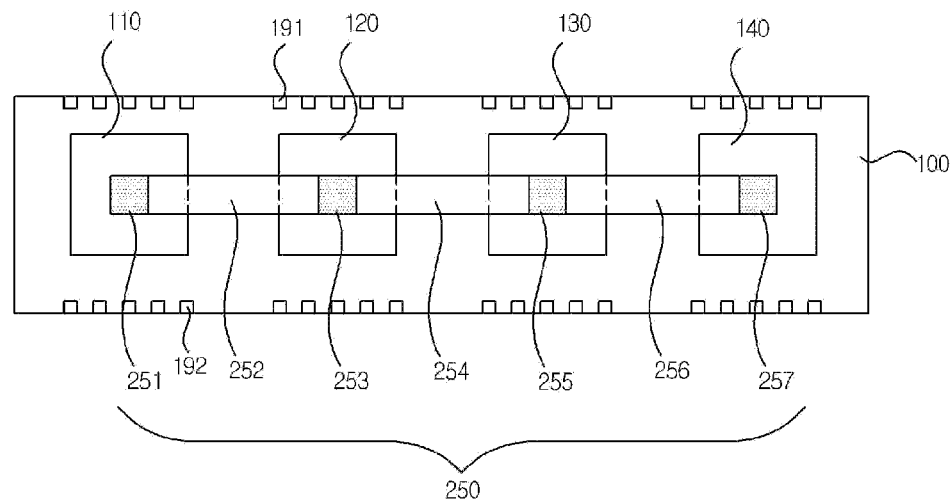
FIG. 13 is a mimetic plan view illustrating a structure of an array lens unit of a camera module according to another exemplary embodiment of the present disclosure.
Figure 14:
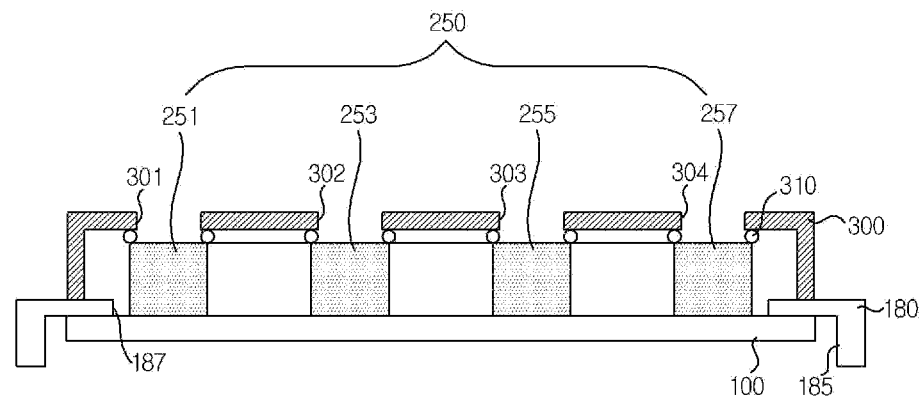
FIG. 14 is a mimetic cross-sectional view illustrating a camera module with the array lens unit of FIG. 13.

FIG. 12 is a mimetic cross-sectional view illustrating another structure of a camera module according to another exemplary embodiment of the present disclosure, FIG. 13 is a mimetic plan view illustrating a structure of an array lens unit of a camera module according to another exemplary embodiment of the present disclosure, and FIG. 14 is a mimetic cross-sectional view illustrating a camera module with the array lens unit of FIG. 13.

Referring to FIG. 12, the camera module according to another exemplary embodiment of the present disclosure is configured such that a holder or a shield can may be fixed to the substrate (180), and a partition (320) extended from the holder or the shield can (300) may be fixed to a substrate area between each of the lens units (210, 220, 230, 240) in order to isolate each lens unit (210, 220, 230, 240).

Referring to FIG. 13, the lens units (251, 253, 255, 257) may be integrally formed on the array lens unit (250).

At this time, the array lens unit (250) may include the lens units (251, 253, 255, 257), and connection units (252, 254, 256) connected to the lens units (251, 253, 255, 257).

Furthermore, each of the image sensors (110, 120, 130, 140) at the array sensor (100) is optically aligned with lens units (251, 253, 255, 257), and the array lens unit (250) may be coupled to the array sensor (100).

At this time, the array lens unit (250) may be directly attached to the array sensor (100), and in a case the array lens units are WLO (Wafer Level Optics) lenses, a lens mount deviation can be minimized.

Hence, the camera module according to another exemplary embodiment of the present disclosure includes a substrate (180) formed with a cavity (185), and a plurality of through holes (181, 182, 193, 184) inside the cavity, an array sensor (100) inserted into the cavity (185) of the substrate (180) and arrayed with a plurality of image sensors, and an array lens unit (250) integrally formed with a plurality of lens units (251, 253, 255, 257) and optically aligned with the lens units (251, 253, 255, 257) each mounted on the image sensors (110, 120, 130, 140) of the array sensor (100).

At this time, the array lens unit (250) is inserted into a through hole (187) of the substrate (180).

Furthermore, a holder disposed with the windows (301, 302, 303, 304) configured to pass an optical image of an object to the lens units (251, 253, 255, 257) of the array lens unit (250) or a shield can (300) may be fixed to the substrate (180) as illustrated in FIG. 8. At this time, a separate optical blocking member configured to block light to a lateral surface of each lens unit may be formed between the lens units, or an optical blocking material may be provided.

Figure 15:
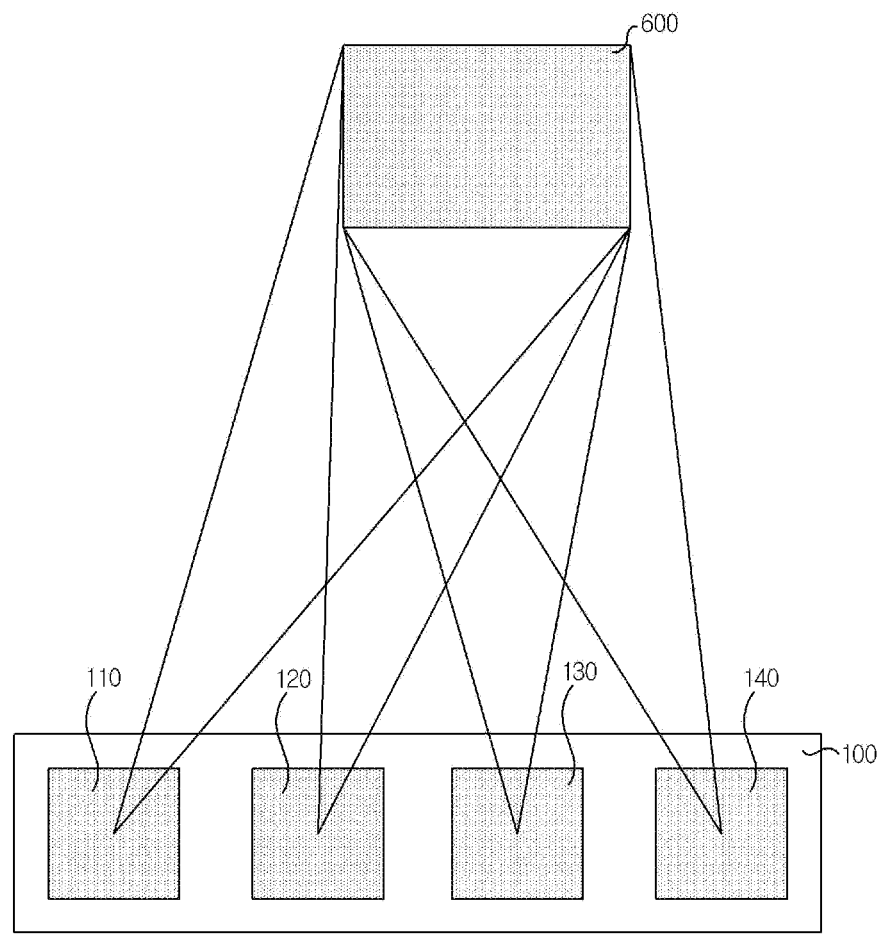
FIG. 15 is a mimetic view illustrating an image photographed by a camera module according to an exemplary embodiment and another exemplary embodiment of the present disclosure.

FIG. 15 is a mimetic view illustrating an image photographed by a camera module according to an exemplary embodiment and another exemplary embodiment of the present disclosure.

As mentioned above, the camera module according to an exemplary embodiment of the present disclosure is applied with an array sensor (100) arrayed with a plurality of image sensors (110, 120, 130, 140), whereby the plurality of image sensors (110, 120, 130, 140) can photograph a 3D image and extract a 3D depth using the photographed image.

A 3D depth can be extracted using images photographed by the plurality of image sensors (110,120,130,140), whereby the plurality of image sensors (110,120,130,140) can be utilized as input devices.

Thus, as illustrated in FIG. 9, much information on an object (600) can be obtained by the plurality of image sensors (110,120,130,140), such that a clearer 3D image and accurate input information or depth information can be obtained.

In addition, no tilt, rotation and shift are generated from sensors due to use of array sensor in the exemplary embodiment of the present disclosure, and deviations among each module can be minimized because lenses are directly attached under this perfect state.

That is, a light-receiving area by each sensor naturally increases if employed with more three sensors instead of two sensors. Although a 4×1 sensor array is exemplified here, the present disclosure is not limited thereto, and an M×N sensor array may be also employed.

Furthermore, the present disclosure is free from problems such as bending, tilt, rotation and shift generated by the length of baseline subsequent to the SMT (Surface Mounting Technology) process that occurs in use of other PCBs.

If deviations between modules disappear as explained above, 3D image degradation is minimized and a clear image can be obtained, and depth information for receiving two or more images can be abundantly obtained.

At this time, if an IR pixel or sensor is applied, depth information at a low light level can be accurately obtained. Furthermore, in case of data output, each image sensor is enabled to perform a parallel output or a serial output, and in case of output of one data, a high speed serial signal can be outputted.

Although the present disclosure has been described with reference to a number of illustrative embodiments thereof, it should be understood that numerous other modifications and embodiments can be devised by those skilled in the art that will fall within the spirit and scope of the principles of this disclosure.

What is claimed is:

1. A camera module, the camera module comprising:
a printed circuit board (PCB);
an array sensor disposed on the PCB and including a plurality of image sensors;
a plurality of lens units mounted on the plurality of image sensors, respectively;
a shield can disposed on the array sensor and spaced from each lens unit; and
a blocking member disposed between the shield can and each lens unit, the blocking member being configured to block spill light,
wherein a partition extended from the shield can is fixed to an array sensor area between each of the lens units in order to isolate each lens unit.

2. The camera module of claim 1, wherein the plurality of image sensors are arrayed on one surface of the array sensor and solder balls are mounted on the other surface of the array sensor.

3. The camera module of claim 2, wherein the array sensor is mounted on the PCB by allowing the solder balls to be soldered to the PCB.

4. The camera module of claim 1, wherein the shield can is disposed with windows configured to pass the optical image of the object to the plurality of lens units and is fixed to the array sensor.

5. The camera module of claim 4, wherein the blocking member includes epoxy.

6. The camera module of claim 1, further comprising a ground line formed at an array sensor area distanced from each of the image sensors, where the shield can disposed with windows configured to pass an optical image of an object to the plurality of lens units is fixed to the array sensor, and the shield can is brought into contact with the ground line.

7. A camera module, comprising:
a substrate formed with a cavity, and including a plurality of through holes;
a shield can disposed on the substrate;
an array sensor inserted into the cavity of the substrate, the array sensor being coupled to a lower surface of the substrate, and the array sensor including a plurality of image sensors; and
a plurality of lens units mounted on uppers surfaces of the images sensors, respectively, through the through holes,
wherein a partition extended from the shield can is fixed to an array sensor area between each of the lens units in order to isolate each lens unit.

8. The camera module of claim 7, wherein first electrode terminals are formed on the array sensor, and second electrode terminals electrically bonded to the first electrode terminals are formed on the substrate.

9. The camera module of claim 7, wherein the shield can is disposed with windows configured to pass an optical image of an object to the lens units and is fixed to the substrate.

10. The camera module of claim 9, wherein a blocking member configured to block spill light is interposed between inner walls of the windows of the shield can and the lens units.

11. The camera module of claim 7, further comprising a ground line formed at an array sensor area distanced from each of the image sensors, where the shield can disposed with windows configured to pass an optical image of an object to the plurality of lens units is fixed to the array sensor, and the shield can is grounded by the ground line and/or a pass.

12. A camera module, comprising:
a substrate formed with a cavity, and including a through hole;
a shield can disposed on the substrate;
an array sensor inserted into the cavity of the substrate, the substrate being coupled to a lower surface of the substrate, and the array sensor including a plurality of image sensors; and
a plurality of lens units mounted on upper surfaces of the image sensors, respectively, through the through hole,
wherein the plurality of lens units are integrally formed to be optically aligned between each lens unit and each image sensor, and
wherein a partition extended from the shield can is fixed to an array sensor area between each of the lens units in order to isolate each lens unit.

13. The camera module of claim 12, further comprising at least one connection unit connected to the lens units.

14. The camera module of claim 12, wherein the shield can is disposed with windows configured to pass an optical image of an object to the plurality of lens units and is fixed to the substrate.

15. The camera module of claim 12, wherein the plurality of lens units is formed with a light blocking member for blocking light from a lateral surface of each lens unit, or provided with a light blocking material.

16. A camera module, comprising:
a printed circuit board (PCB);
an array sensor disposed on the PCB and including a plurality of image sensors;
a plurality of lens units mounted on the plurality of image sensors, respectively,
at least one connection unit connected to the plurality of lens units; and
a shield can disposed on the array sensor and spaced from each lens unit and the connection unit,
wherein the plurality of lens units and the at least one connection unit are integrally formed to be optically aligned between each lens unit and each image sensor, and
wherein a partition extended from the shield can is fixed to an array sensor area between each of the lens units in order to isolate each lens unit.

17. The camera module of claim 16, comprising a blocking member disposed between the shield can and each lens unit, and configured to block spill light.

18. The camera module of claim 16, wherein the shield can is disposed with windows configured to pass an optical image of an object to the plurality of lens units and is fixed to the array sensor.

* * * * *